(12) United States Patent
Chang et al.

(10) Patent No.: US 9,281,411 B1
(45) Date of Patent: Mar. 8, 2016

(54) THIN FILM TRANSISTOR

(71) Applicant: NATIONAL SUN YAT-SEN UNIVERSITY, Kaohsiung (TW)

(72) Inventors: Ting-Chang Chang, Kaohsiung (TW); Ming-Yen Tsai, Kaohsiung (TW); Tian-Yu Hsieh, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/661,707

(22) Filed: Mar. 18, 2015

(30) Foreign Application Priority Data

Feb. 4, 2015 (TW) .............................. 104103723 A

(51) Int. Cl.
*H01L 29/00* (2006.01)
*H01L 29/786* (2006.01)
*H01L 29/417* (2006.01)
*H01L 29/423* (2006.01)
*H01L 29/49* (2006.01)

(52) U.S. Cl.
CPC .... *H01L 29/78696* (2013.01); *H01L 29/41733* (2013.01); *H01L 29/42384* (2013.01); *H01L 29/4908* (2013.01); *H01L 29/7869* (2013.01)

(58) Field of Classification Search
CPC ...................... H01L 29/78696; H01L 29/7869; H01L 29/41733; H01L 29/42384; H01L 29/4908
See application file for complete search history.

(56) References Cited

U.S. PATENT DOCUMENTS

| 2008/0038882 | A1* | 2/2008 | Takechi | ............... | H01L 29/4908 438/151 |
| 2010/0038641 | A1* | 2/2010 | Imai | ................... | H01L 29/78696 257/57 |
| 2010/0314618 | A1* | 12/2010 | Tanaka | ............... | H01L 21/02554 257/43 |

OTHER PUBLICATIONS

Kenji Nomura et al "Room-temperature fabrication of transistors using amorphous oxide semiconductors," Nature, vol. 432, Nov. 25, 2004, pp. 488-492.

* cited by examiner

*Primary Examiner* — Victor A Mandala
*Assistant Examiner* — Quovaunda V Jefferson
(74) *Attorney, Agent, or Firm* — Muncy, Geissler, Olds & Lowe PC

(57) ABSTRACT

A thin film transistor is disclosed in the present invention, including a substrate, a gate, an insulating layer, a source, a drain and an active layer. The gate is arranged on the substrate. The insulating layer is arranged on the gate. The source and the drain are arranged on the insulating layer. The active layer is arranged between the source and the drain, and is formed by a bottom layer, an intermediate layer and a top layer stacked together on the insulating layer. The conductivity of the intermediate layer is higher than that of the bottom layer, and the conductivity of the bottom layer is higher than that of the top layer. As such, the disadvantage of low carrier mobility as commonly seen in the conventional thin film transistor is overcome.

6 Claims, 4 Drawing Sheets

THIN FILM TRANSISTOR

BACKGROUND OF THE INVENTION

1. Field of the Invention

The present invention generally relates to a thin film transistor and, more particularly, to a thin film transistor having an active layer being multi-layered.

2. Description of the Related Art

Due to the progression of the semiconductor technology, thin film transistors are developed as electrical switches, and are widely used in electrical equipments. As an example of flat panel displays, the thin film transistor is used as a switch that controls the charging or discharging operations of the storage capacitor used in controlling the pixels.

A conventional thin film transistor has an active layer generally made of a single-layered metal oxide. One example of this conventional thin film transistor can be seen in the paper entitled "Room-temperature fabrication of transistors using amorphous oxide semiconductors" as published by Keniji Nomura, Hiromichi Ohta, Akihiro Takagi, Toshio Kamiya, Masahiro Hirano, and Hideo Hosono in Nature, Vol. 432.

In the conventional thin film transistor, the amorphous/poly silicon of the active layer is replaced by InGaZnO (IGZO) in order to improve the utility of the metal oxide in flat pane displays. However, during the use of the conventional thin film transistor, the carriers cannot be concentrated when flowing in the active layer, resulting in a low carrier mobility.

In light of the above, it is necessary to improve the conventional thin film transistor for improved utility.

SUMMARY OF THE INVENTION

It is therefore the objective of this invention to provide a thin film transistor in which the carriers in the active layer of the transistor can be concentrated when the carriers flow in the active layer, thus increasing the carrier mobility of the transistor component.

In an embodiment, the thin film transistor includes a substrate, a gate, an insulating layer, a source, a drain and an active layer. The gate is arranged on the substrate. The insulating layer is arranged on the gate. The source and the drain are arranged on the insulating layer. The active layer is arranged between the source and the drain, and is formed by a bottom layer, an intermediate layer, and a top layer stacked together on the insulating layer. The conductivity of the intermediate layer is higher than that of the bottom layer, and the conductivity of the bottom layer is higher than that of the top layer.

In a form shown, the intermediate layer is indium tin zinc oxide.

In the form shown, the bottom layer is indium gallium zinc oxide with low oxygen.

In the form shown, the top layer is indium gallium zinc oxide with high oxygen.

In the form shown, the gate is indium tin oxide.

In the form shown, the insulating layer is silicon dioxide or silicon nitride.

The active layer of the thin film transistor is a multi-layered structure formed by the bottom layer, the intermediate layer and the top layer stacked together. Due to the higher conductivity of the intermediate layer than the bottom layer, and the higher conductivity of the bottom layer than the top layer, forming the top layer and the bottom layer as quasi-insulating layers with high insulation. The carriers are concentrated in the intermediate layer when flowing in the intermediate layer. Thus, the path for transmission of the electric current is limited, and the drain current is significantly increased. Due to the carrier concentration-control, the main carriers are confined to the intermediate layer instead of the interface between the active layer and the insulating layer as well as the interface between the active layer and aback dielectric layer that can be later formed on the active layer. Here, the back dielectric could be an etch-stop layer or a passivation layer. Therefore, most of the channel carriers are not captured by interface trap states and do not suffer from the surface scattering during on-state operation. The carrier mobility of the transistor component is increased, which solves the problem of low carrier mobility of the conventional transistor component.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
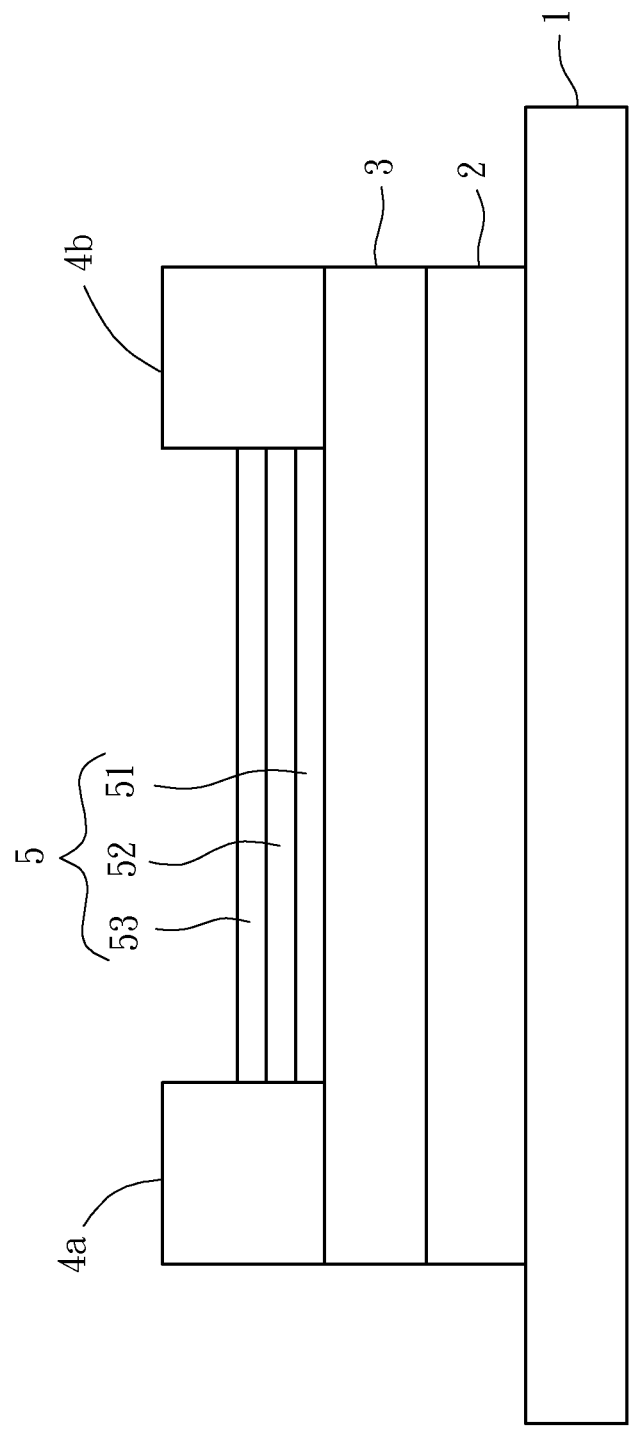
FIG. 1 is a cross sectional view of a thin film transistor according to the present invention.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Please refer to FIG. 1 which shows a cross sectional view of a thin film transistor according to an embodiment of the present invention. The thin film transistor includes a substrate 1, a gate 2, an insulating layer 3, a source 4a, a drain 4b and an active layer 5. The gate 2 is arranged on the substrate 1, and the insulating layer 3 is arranged on the gate 2. The source 4a, the drain 4b, and the active layer 5 are arranged on the insulating layer 3, with the source 4a and the drain 4b arranged at two sides of the active layer 5. The active layer 5 includes a bottom layer 51, an intermediate layer 52, and a top layer 53 stacked together, and the bottom layer 51 is arranged on the insulating layer 3. The conductivity of the intermediate layer 52 is higher than that of the bottom layer 51, and the conductivity of the bottom layer 51 is higher than that of top layer 53.

In this embodiment, the intermediate layer 52 of the active layer 5 may be indium tin zinc oxide (ITZO). The bottom layer 51 may be indium gallium zinc oxide with low oxygen, and the top layer 53 may be indium gallium zinc oxide with high oxygen. For example, during the deposition process of the active layer 5, the flow ratio of argon/oxygen (Ar/O) may be 30/10 for the top layer 53; 30/0 for the bottom layer 51; and 30/0 for the intermediate layer 52. The conductivity of indium tin zinc oxide is higher than that of indium gallium zinc oxide, and the conductivity of indium gallium zinc oxide is proportional to its oxygen content. As such, the active layer is characterized in that the conductivity of the intermediate layer 52 is the highest, and the conductivity of the top layer 53 is the lowest. Therefore, the electric current of the thin film transistor tends to flow through the intermediate layer 52 with the highest conductivity. Moreover, the substrate 1 may be any conventional substrate, such as a glass substrate on which the gate 2, the insulating layer 3, the source 4a, the drain 4b and the active layer 5 are sequentially deposited. The gate 2 may be in a form of a conductive thin film, such as a metallic thin film. The insulating layer 3 may be made of an insulating material, such as silicon dioxide or silicon nitride. The source and the drain may be made of a conductive material, such as indium tin oxide. However, this is not to be taken as a limited sense.

Figure 2:
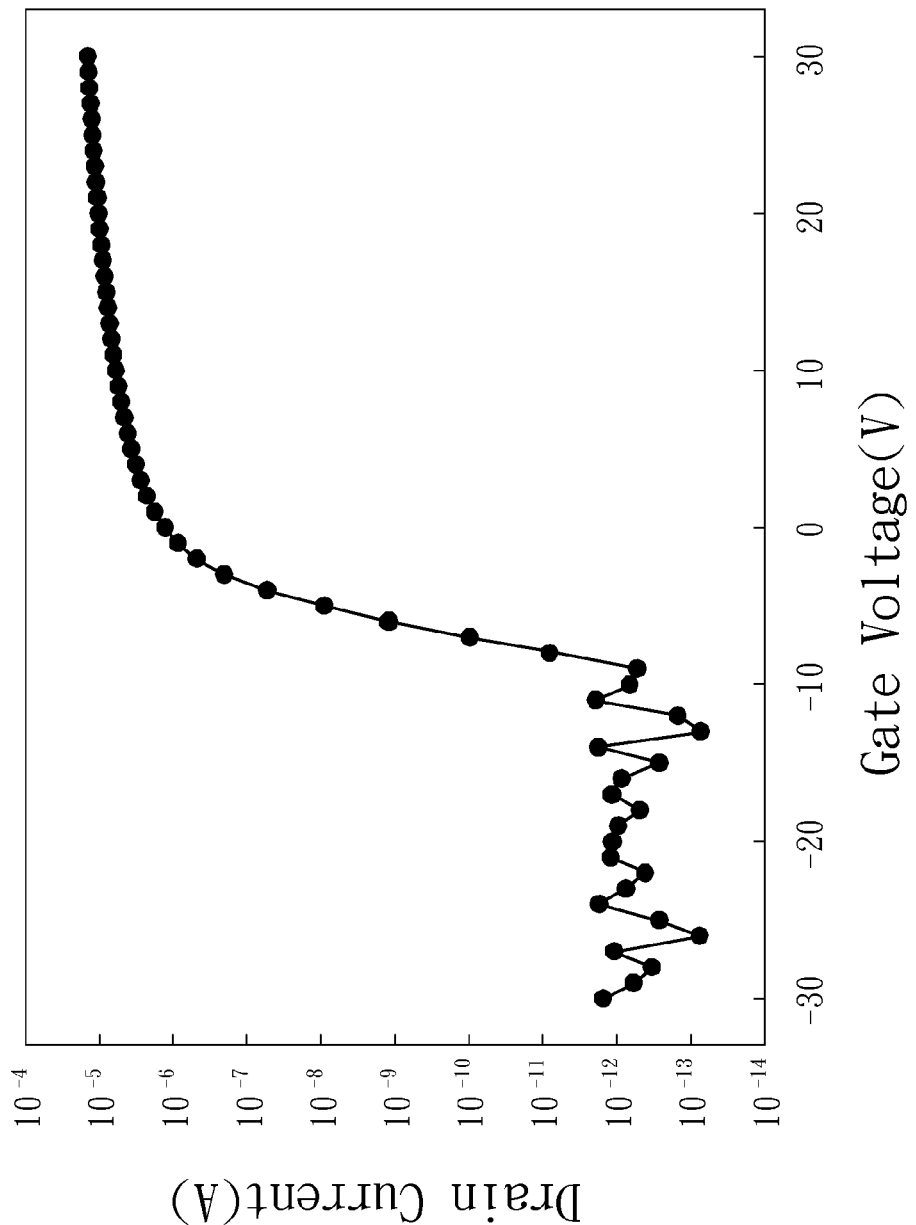
FIG. 2 is a current-voltage relationship diagram of the thin film transistor of the present invention.
Figure 3:
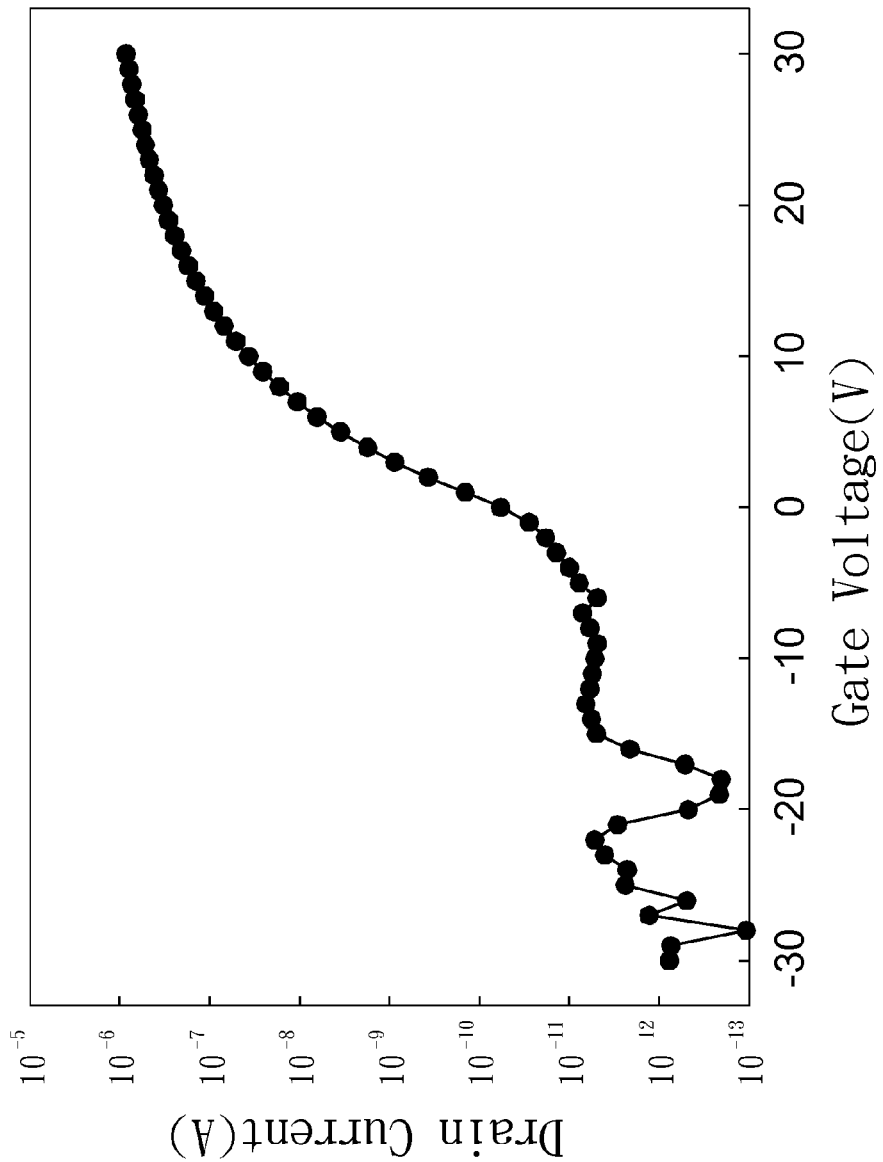
FIG. 3 is a current-voltage relationship diagram of a conventional thin film transistor with its active layer being single-layered IGZO.
Figure 4:
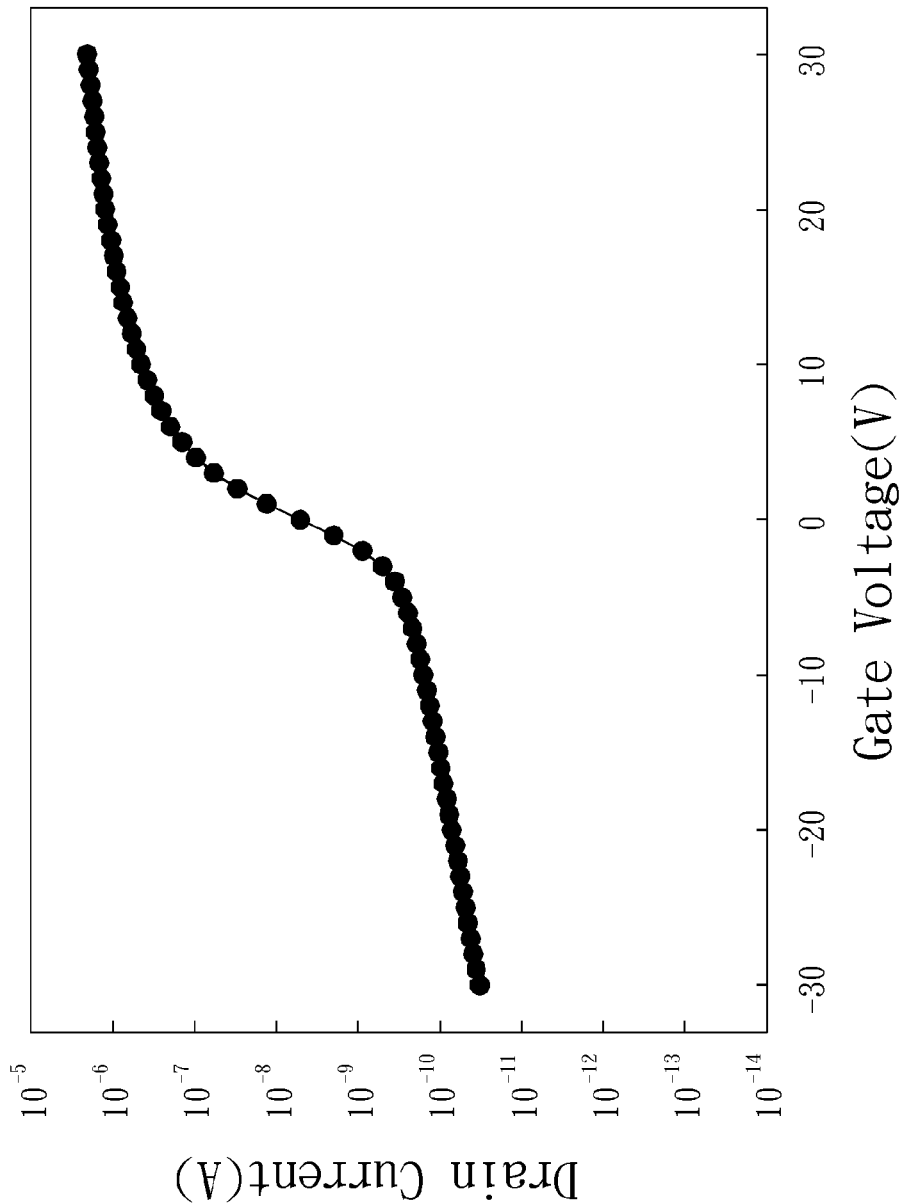
FIG. 4 is a current-voltage relationship diagram of another conventional thin film transistor with its active layer being single-layered ITZO.

Please refer to FIG. 2, which is the current-voltage relationship diagram of the thin film transistor in the present invention. The carrier mobility of the thin film transistor reaches 46.5 cm$^2$/V-s when the IGZO/ITZO/IGZO tri-layers are used as the active layer. Please refer to FIG. 3, which is the current-voltage relationship diagram of the conventional thin film transistor with its active layer being single-layered IGZO. The carrier mobility of the conventional thin film transistor is 6.6 cm$^2$/V-s when its active layer is single-layered IGZO. Please refer to FIG. 4, which is the current-voltage relationship diagram of the conventional thin film transistor with its active layer being single-layered ITZO. The carrier mobility of the conventional thin film transistor with its active layer being single-layer ITZO is 13.9 cm$^2$/V-s. With reference to FIGS. 2-4, since the active layer of the thin film transistor in the present invention is multi-layered, the electric current is concentrated in the intermediate layer of the active layer, which results in a significant increase of the drain current. The carrier mobility of the thin film transistor in the present invention is also higher than that of the conventional thin film transistor having a single-layered active layer.

Furthermore, depositing the top layer 53 of the thin film transistor under high oxygen flow is able to form a quasi-insulating layer with high insulation. As such, the characteristic of the active layer 5 will not be affect by the environment, and the damage to the active layer 5 resulting from subsequent processes, such as the formation of a passivation layer or an etch-stop layer, can be prevented. Moreover, the electric current is prevented from flowing through the back-channel, thus improving the concentration of the carriers.

In conclusion, the thin film transistor of the present invention is characterized as follows. The active layer arranged between the insulating layer, the source and the drain is formed by the bottom layer, the intermediate layer and the top layer stacked together. Due to the higher conductivity of the intermediate layer than the bottom layer, and the higher conductivity of the bottom layer than the top layer, the top layer and the bottom layer are formed as quasi-insulating layers. The carriers are concentrated in the intermediate layer when the current flows into the active layer. Thus, the path for transmission of the electric current is limited, and the drain current is significantly increased. In addition, the carrier mobility of the thin film transistor in the present invention is higher than the conventional thin film transistor with its active layer being single-layered.

Therefore, in the thin film transistor of the present invention, since the conductivity of the intermediate layer is higher than that of the bottom layer, and the conductivity of the bottom layer is higher than that of the top layer, both the top layer and the bottom layer form quasi-insulating layers with high insulation. As such, the carriers are concentrated in the intermediate layer when the current flows into the active layer. Thus, the carrier mobility of the transistor component is increased, which solves the problem of low carrier mobility of the conventional transistor component.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A thin film transistor, comprising:
   a substrate;
   a gate arranged on the substrate;
   an insulating layer arranged on the gate;
   a source arranged on the insulating layer;
   a drain arranged on the insulating layer; and
   an active layer arranged between the source and the drain,
   wherein the active layer comprises a bottom layer, an intermediate layer and a top layer stacked together, wherein the bottom layer is arranged on the insulating layer, wherein the conductivity of the intermediate layer is higher than the conductivity of the bottom layer, and wherein the conductivity of the bottom layer is higher than the conductivity of the top layer.

2. The thin film transistor as claimed in claim 1, wherein the intermediate layer is indium tin zinc oxide.

3. The thin film transistor as claimed in claim 1, wherein the bottom layer is indium gallium zinc oxide with low oxygen.

4. The thin film transistor as claimed in claim 1, wherein the top layer is indium gallium zinc with high oxygen.

5. The thin film transistor as claimed in claim 1, wherein the gate is indium zinc oxide.

6. The thin film transistor as claimed in claim 1, wherein the insulating layer is silicon dioxide or silicon nitride.

* * * * *